United States Patent
Kang et al.

(10) Patent No.: US 9,817,269 B2
(45) Date of Patent: Nov. 14, 2017

(54) DISPLAY APPARATUS AND METHOD OF MANUFACTURING THE SAME

(71) Applicant: Samsung Display Co., Ltd., Yongin-si, Gyeonggi-Do (KR)

(72) Inventors: Eui Jeong Kang, Suwon-si (KR); Seong-Yong Hwang, Asan-si (KR); Hyuk-Hwan Kim, Hwaseong-si (KR); Young-keun Lee, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 113 days.

(21) Appl. No.: 14/749,094

(22) Filed: Jun. 24, 2015

(65) Prior Publication Data

US 2016/0146408 A1      May 26, 2016

(30) Foreign Application Priority Data

Nov. 25, 2014  (KR) .......................... 10-2014-0165358

(51) Int. Cl.
*G02F 2/00* (2006.01)
*G02F 1/1335* (2006.01)
(Continued)

(52) U.S. Cl.
CPC .................. *G02F 1/133603* (2013.01); *G02F 2001/133614* (2013.01); *H01L 25/0753* (2013.01);
(Continued)

(58) Field of Classification Search
CPC ...... G02F 1/25; G02F 1/133603; G02F 2/004; G02F 2002/006; G02F 2002/008
See application file for complete search history.

(56) References Cited

U.S. PATENT DOCUMENTS

| 7,585,094 B2 | 9/2009 | Chang |
| 8,704,263 B2 | 4/2014 | Son |

(Continued)

FOREIGN PATENT DOCUMENTS

| KR | 1006662220000 B1 | 1/2007 |
| KR | 10-2008-0018309 A | 2/2008 |

(Continued)

OTHER PUBLICATIONS

P. Schlotter et al., Luminescence conversion of blue light emitting diodes, Applied Physics A, Apr. 1, 1997, vol. 64, Issue 4, pp. 417-418, Publisher Springer-Verlag, Freiburg, Germany.

(Continued)

*Primary Examiner* — Robert Vetere
(74) *Attorney, Agent, or Firm* — H.C. Park & Associates, PLC

(57) ABSTRACT

A manufacturing method of a display apparatus includes providing a backlight unit under a display panel to provide a light to the display panel. The providing of the backlight unit includes disposing a light source on a substrate to emit the light, disposing a mask above the light source, which includes a first opening and a second opening greater than the first opening disposed under the first opening, and providing a transparent resin including a wavelength converting material on the light source through the first and second openings to form a wavelength converting member. A width in a cross section of the wavelength converting member along a direction substantially vertical to the substrate becomes smaller as a distance from the substrate becomes greater.

20 Claims, 8 Drawing Sheets

(51) Int. Cl.
*H01L 25/075* (2006.01)
*H01L 33/50* (2010.01)
(52) U.S. Cl.
CPC .. *H01L 33/508* (2013.01); *H01L 2224/16225* (2013.01); *H01L 2924/181* (2013.01)

(56) References Cited

U.S. PATENT DOCUMENTS

| | | | |
|---|---|---|---|
| 2003/0214616 A1* | 11/2003 | Komoto | G02B 6/0023 349/96 |
| 2007/0263408 A1* | 11/2007 | Chua | G02F 1/133603 362/612 |
| 2008/0290351 A1* | 11/2008 | Ajiki | H01L 25/0753 257/88 |
| 2011/0141716 A1* | 6/2011 | Wiesmann | G02F 1/133603 362/97.1 |
| 2012/0193660 A1 | 8/2012 | Donofrio et al. | |
| 2014/0097460 A1 | 4/2014 | Chang | |

FOREIGN PATENT DOCUMENTS

| | | |
|---|---|---|
| KR | 10-2012-0020438 A | 3/2012 |
| KR | 10-2012-0038806 A | 4/2012 |
| KR | 10-2012-0077252 A | 7/2012 |
| KR | 10-2012-0128464 A | 11/2012 |

OTHER PUBLICATIONS

Hao Wu et al., Three-Band White Light From InGaN-Based Blue LED Chip Precoated With Green/Red Phosphors, IEEE Photonics Technology Letters, vol. 17, No. 6, Jun. 2005.

Liu et al., Optical Analysis of Phosphor's Location for High-Power Light-Emitting Diodes, IEEE Transactions on Device and Materials Reliability, Vol. 9, No. 1, Mar. 2009.

* cited by examiner

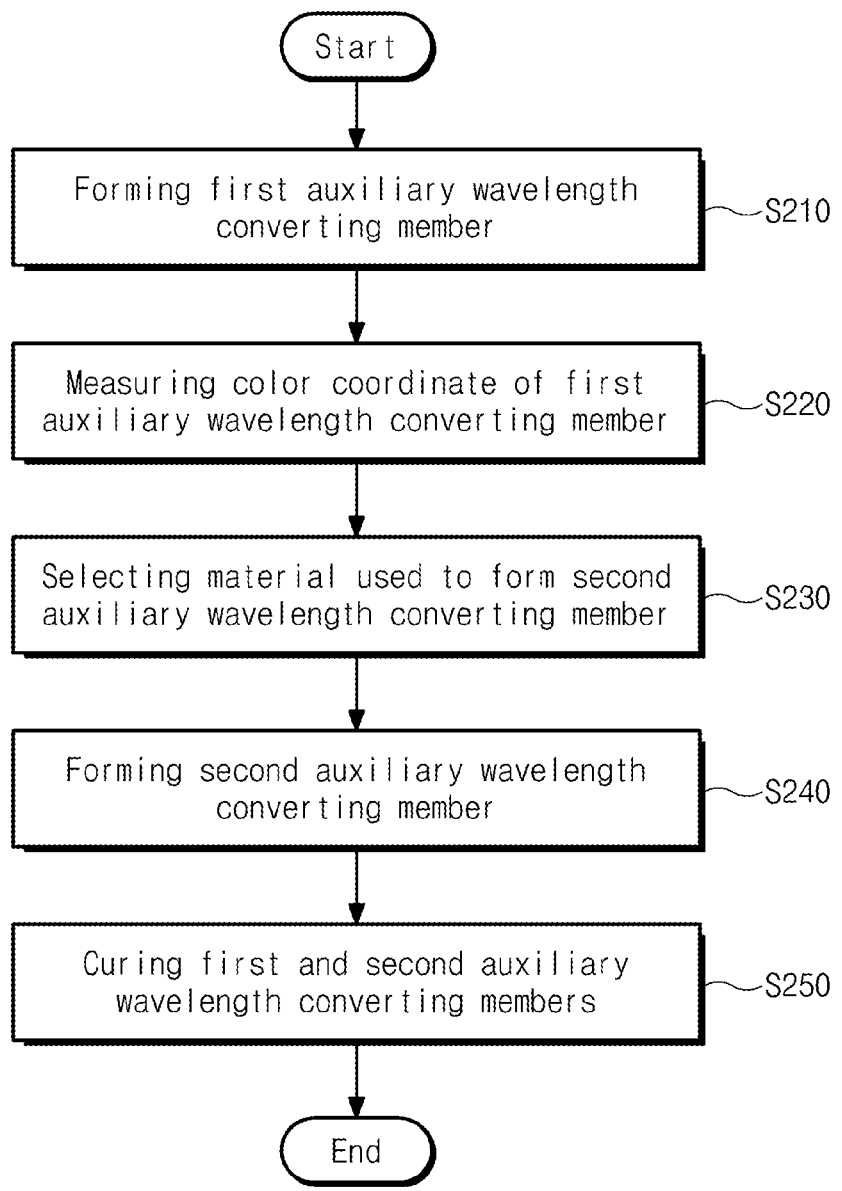

DISPLAY APPARATUS AND METHOD OF MANUFACTURING THE SAME

CLAIM OF PRIORITY

This U.S. non-provisional patent application claims the priority of and all the benefits accruing under 35 U.S.C. §119 of Korean Patent Application No. 10-2014-0165358, filed on Nov. 25, 2014 in Korean Intellectual Property Office ("KIPO"), the contents of which are hereby incorporated by reference in its entirety.

BACKGROUND OF THE INVENTION

1. Field of Disclosure

The present disclosure relates to a display apparatus and a method of manufacturing the same. More particularly, the present disclosure relates to a display apparatus having improved display quality and a method of manufacturing the display apparatus.

2. Description of the Related Art

A light emitting diode (LED) is a semiconductor light emitting device in which electrons and holes are combined in a p-n semiconductor junction structure by application of current thereby emitting certain light. In general, it is difficult to generate a light having a desired color using only a light having a specific wavelength, which is emitted from the LED. Accordingly, various technologies, which generate the light having the desired color, e.g., a white light, by mixing lights having different wavelengths, have been developed. Among them, a technology that changes the wavelength of the light using a wavelength converting member in which a wavelength converting material is included. The wavelength converting member is formed using a resin with which a fluorescent material is mixed and disposed on a substrate on which the LED is mounted. In this case, a color deviation occurs according to an angle at which a user views the LED, and thus the white light is not uniform.

SUMMARY OF THE INVENTION

The present disclosure provides a display apparatus having improved display quality.

The present disclosure provides a method of manufacturing the display apparatus.

Embodiments of the inventive concept provide a method of manufacturing a display apparatus includes providing a backlight unit under a display panel to provide a light to the display panel. The providing of the backlight unit includes disposing a light source on a substrate to emit the light, disposing a mask above the light source, the mask including a first opening formed therethrough and a second opening greater than the first opening, disposed under the first opening, and formed therethrough, and providing a transparent resin including a wavelength converting material on the light source through the first and second openings of the mask to form a wavelength converting member covering the light source. A width in a cross section of the wavelength converting member along a direction substantially vertical to the substrate becomes smaller as a distance from the substrate becomes greater.

The forming of the wavelength converting member includes forming a first auxiliary wavelength converting member using the second opening and forming a second auxiliary wavelength converting member on the first auxiliary wavelength converting member using the first opening.

The forming of the wavelength converting member further includes measuring a color coordinate of the first auxiliary wavelength converting member before the second auxiliary wavelength converting member is formed.

The forming of the wavelength converting member further includes selecting a material used to form the second auxiliary wavelength converting member in accordance with the color coordinate of the first auxiliary wavelength converting member.

The first auxiliary wavelength converting member includes the transparent resin and the wavelength converting material and the second auxiliary wavelength converting member includes the transparent resin.

The second auxiliary wavelength converting member further includes the wavelength converting material.

The forming of the wavelength converting member further includes controlling an amount of the wavelength converting material included in the second auxiliary wavelength converting member in accordance with the color coordinate of the first auxiliary wavelength converting member.

The wavelength converting material included in the first auxiliary wavelength converting member partially moves to the second auxiliary wavelength converting material by mixing the first auxiliary wavelength converting member with the second auxiliary wavelength converting member.

The forming of the wavelength converting member further includes curing the first and second auxiliary wavelength converting members after the first and second auxiliary wavelength converting members are formed.

The forming of the wavelength converting member includes primary curing the first auxiliary wavelength converting member, forming the second auxiliary wavelength converting member after the first auxiliary wavelength converting member is primary cured, and secondary curing the second auxiliary wavelength converting member.

The forming of the wavelength converting member further includes measuring a color coordinate of the first auxiliary wavelength converting member before the second auxiliary wavelength converting member is formed and after the first auxiliary wavelength converting member is primary cured.

The first and second auxiliary wavelength converting members include the transparent resin and the wavelength converting material.

The forming of the wavelength converting member further includes controlling an amount of the wavelength converting material of the second auxiliary wavelength converting member in accordance with the color coordinate of the first auxiliary wavelength converting member.

The method further includes disposing a lens part on the wavelength converting member.

The disposing of the mask includes disposing a first auxiliary mask provided with the second opening formed therethrough on the light source and disposing a second auxiliary mask provided with the first opening formed therethrough on the light source.

The wavelength converting member is formed by a squeeze manner.

Embodiments of the inventive concept provide a display apparatus includes a display panel receiving a light to display an image and a backlight unit providing the light to the display panel. The backlight unit includes a substrate, a light source mounted on the substrate to emit the light, and a wavelength converting member covering the light source to convert a wavelength of the light emitted from the light source. The wavelength converting member includes a first auxiliary wavelength converting member covering the light source and a second auxiliary wavelength converting member disposed on the light source such that the first auxiliary wavelength converting member is disposed between the second auxiliary wavelength converting member and the light source. The first auxiliary wavelength converting member has a size greater than a size of the second auxiliary wavelength converting member when viewed in a plan view.

When a surface at which the second auxiliary wavelength converting member meets with the first auxiliary wavelength converting member is defined as a contact surface, the contact surface is surrounded by the first auxiliary wavelength converting member when viewed in a plan view.

The display apparatus further includes a lens part disposed on the wavelength converting member to diffuse the light.

The first and second auxiliary wavelength converting members include a wavelength converting material.

According to the above, the shape of the wavelength converting member is controlled, and thus the color deviation of the light, which is caused by the angle at which the user views the light source, is reduced. As a result, the backlight unit provides the uniform white light.

In addition, the shape of the wavelength converting member is easily controlled by using the mask provided with the first opening and the second opening having the size different from that of the first opening.

Further, the second auxiliary wavelength converting member is formed in accordance with the color coordinate of the first auxiliary wavelength converting member after the first auxiliary wavelength converting member. Therefore, the color coordinate is easily controlled and defects in the color coordinate are reduced.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein:

FIG. 9 is a flowchart showing a method of forming a wavelength converting member according to another exemplary embodiment of the present disclosure.

DETAILED DESCRIPTION OF THE INVENTION

Figure 1:
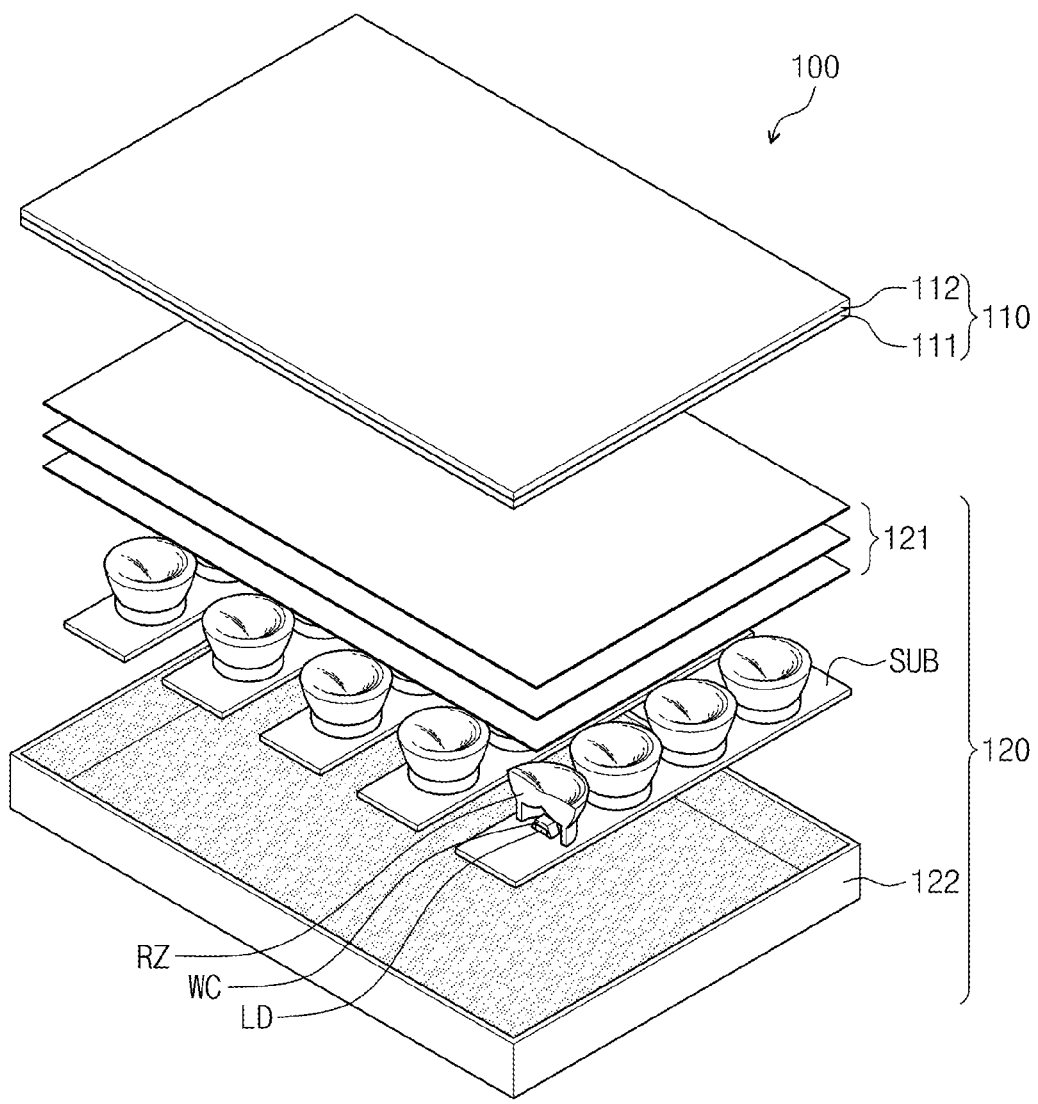
FIG. 1 is an exploded perspective view showing a display apparatus according to an exemplary embodiment of the present disclosure.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

Figure 2:
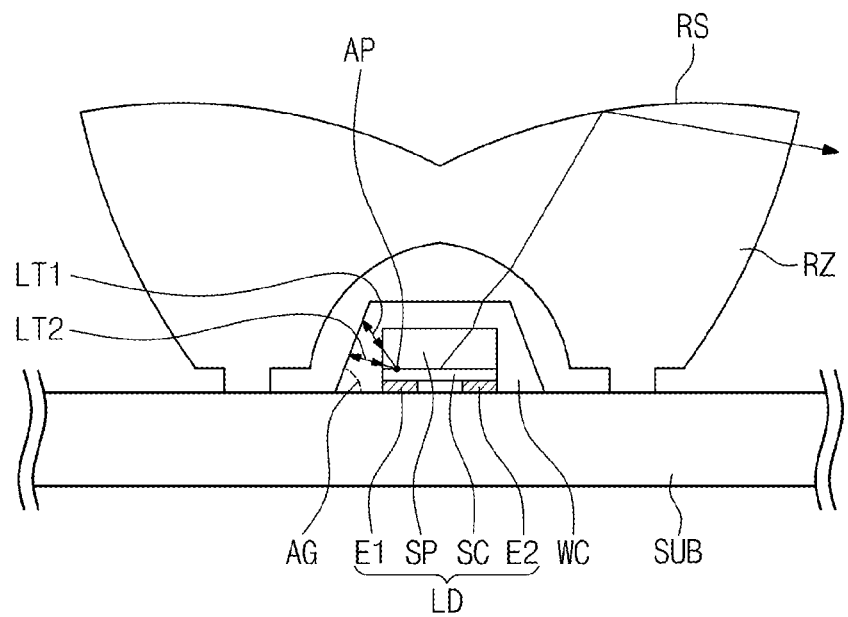
FIG. 2 is an enlarged cross-sectional view showing a portion of the display apparatus shown in FIG. 1.

FIG. 1 is an exploded perspective view showing a display apparatus 100 according to an exemplary embodiment of the present disclosure and FIG. 2 is an enlarged cross-sectional view showing a portion of the display apparatus 100 shown in FIG. 1.

Referring to FIGS. 1 and 2, the display apparatus 100 includes a display panel 110 and a backlight unit 120.

The display panel 110 displays an image. The display panel 110 is a liquid crystal display panel, an electrowetting display panel, an electrophoretic display panel, or a microelectromechanical system display panel. In the present exemplary embodiment, the liquid crystal display panel will be displayed as the display panel 110.

The display panel 110 has a substantially quadrangular plate shape of two pairs of sides. In the present exemplary embodiment, the display panel 110 has a substantially rectangular shape of a pair of long sides and a pair of short sides. The display panel 110 includes a display substrate 111, an opposite substrate 112 facing the display substrate 111, and a liquid crystal layer (not shown) interposed between the display substrate 111 and the opposite substrate 112. When viewed in a plan view, the display panel 110 includes a display area in which the image is displayed and a non-display area surrounding the display area, in which the image is not displayed.

The backlight unit 120 provides a light to the display panel 110 and is disposed under the display panel 110. The backlight unit 120 includes optical sheets 121, an accommodating part 122, and a light source LD.

The accommodating member 122 accommodates the light source LD and the optical sheets 121.

The optical sheets 121 are configured to include a diffusion sheet, a prism sheet and a protective sheet. The diffusion sheet diffuses the light and the prism sheet collects the diffused light such that a direction in which the diffused light travels substantially coincides with a normal line direction of the display panel 110. The protection sheet protects the prism sheet from external impacts. In the present exemplary embodiment, the optical sheets 121 include one diffusion sheet, one prism sheet, and one protection sheet, but they should not be limited thereto or thereby. That is, at least one of the diffusion sheet, the prism sheet, and the protection sheet of the optical sheets 121 may be provided in a plural number, and one or more sheets of the optical sheets 121 may be omitted if necessary.

The light source LD is mounted on a substrate SUB to receive a driving voltage from the substrate SUB. In the present exemplary embodiment, the light source LD has a flip chip structure. The light source LD includes a first electrode E1, a second electrode E2, a substrate SP, and a semiconductor layer SC.

The first and second electrodes E1 and E2 are electrically connected to an electrode pad (not shown) disposed on the substrate SUB. The first electrode E1 may be, but not limited to, an anode electrode and the second electrode E2 may be, but not limited to, a cathode electrode.

The semiconductor layer SC includes a chemical compound semiconductor and is a layer in which electrons and holes injected into the semiconductor layer SC are combined with each other to emit the light. The light source LD may be, but not limited to, a blue light source emitting a blue light. According to another embodiment, the light source LD may emit a red, yellow, or green light.

The light exits through the substrate SP. That is, since the light travels through the substrate SP in the flip chip structure, a light loss does not occur in a metal contact portion, a coupling pad, or an electrode connection portion, and thus a light-extraction efficiency is improved. The substrate SP includes a transparent material, such as sapphire (Al2O3), silicon carbide (SiC), gallium arsenide (GaAs), etc.

A wavelength converting member WC is disposed on the light source LD to cover the light source LD and to convert a wavelength of the light. The wavelength converting member WC is formed by dispersing a wavelength converting material in a transparent resin, e.g., a silicon resin, an epoxy resin, etc. The wavelength converting material includes a fluorescent substance or a quantum dot. For instance, when the light source LD emits the blue light, the fluorescent substance dispersed in the transparent resin includes at least one of a garnet-based fluorescent substance (YAG, TAG), a silicate-based fluorescent substance, a nitride-based fluorescent substance, and an oxynitride-based fluorescent substance.

In the present exemplary embodiment, the wavelength converting member WC has a substantially trapezoid shape in a cross-sectional view. Therefore, a difference of distances between the light source LD and an outer surface of the wavelength converting member WC according to different emission angles of the light emitted from the light source LD may be minimized.

In more detail, the light emitting from a point AP of the semiconductor layer SC travels in various directions. Hereinafter, the distance between the outer surface of the substrate SP and the outer surface of the wavelength converting member WC in a direction in which the light travels is referred to as a first distance LT1 and the distance between the outer surface of the substrate SP and the outer surface of the wavelength converting member WC in another direction disposed more adjacent to the substrate SUB than the first distance LT1, in which the light travels, is referred to as a second distance LT2.

Different from the present exemplary embodiment, when a difference between the first distance LT1 and the second distance LT2 is great, a probability in which the light traveling along a relatively long distance among the first and second distances LT1 and LT2 collides with the wavelength converting material is higher than a probability in which the light traveling along a relatively short distance among the first and second distances LT1 and LT2 collides with the wavelength converting material. For instance, when the light source LD emits the blue light and the wavelength converting material converts the wavelength of the blue light to a wavelength of a yellow light, an amount of the light having the yellow color increases as the distance between the surface of the substrate SP and the surface of the wavelength converting member WC becomes longer, causing non-uniform white light illumination. However, according to the present exemplary embodiment, since the wavelength converting member WC has the trapezoid shape in the cross-sectional view, the difference between the first and second distances LT1 and LT2 is more reduced than that when the wavelength converting member WC has a rectangular shape. As a result, a color deviation that occurs according to an angle at which a user views the light source LD may be reduced, and the backlight unit 120 may provide the display panel 110 with the uniform white light.

An angle AG between the substrate SUB and a tapered surface of the side surface of the wavelength converting member WC is in a range from about 45 degrees to about 85 degrees, more properly, about 75 degrees to about 85 degrees. When the wavelength converting member WC has the trapezoid shape in the cross-sectional view, the color deviation may be more reduced than when the wavelength converting member WC has the rectangular shape.

A lens RZ is disposed on the wavelength converting member WC. In the present exemplary embodiment, the lens RZ may be, but not limited to, a reflective type lens. For instance, the light is reflected by an upper surface RS of the lens RZ, and then exits through a side surface of the lens RZ. The light emitted from the light source LD is diffused by the lens RZ, and thus the backlight unit 120 is slimmed and the number of the light sources LD is reduced. Consequently, a manufacturing cost of the display apparatus 100 is reduced.

Figure 3:
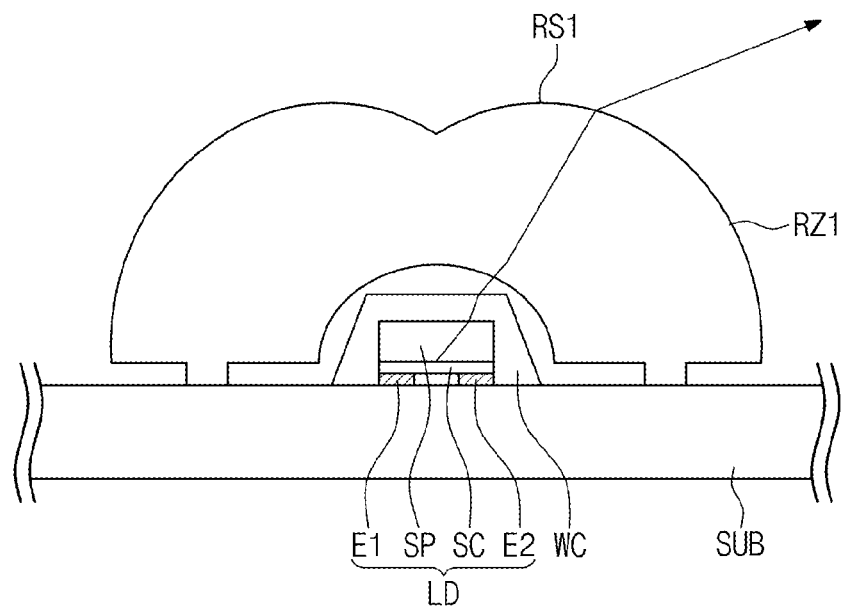
FIG. 3 is an enlarged cross-sectional view showing a portion of a display apparatus according to another exemplary embodiment of the present disclosure.

FIG. 3 is an enlarged cross-sectional view showing a portion of a display apparatus according to another exemplary embodiment of the present disclosure. In FIG. 3, the same reference numerals denote the same elements in FIG. 2, and thus detailed descriptions of the same elements will be omitted.

Referring to FIG. 3, a lens RZ1 is disposed on the wavelength converting member WC. In the present exemplary embodiment, the lens RZ1 may be, but not limited to, a refractive type lens. For instance, the light is refracted by an outer surface RS1 of the lens RZ1, and then exits through a side surface of the lens RZ1. The light emitted from the light source LD is diffused by the lens RZ1, and thus the backlight unit 120 (refer to FIG. 1) is slimmed and the number of the light sources LD is reduced. Consequently, the manufacturing cost of the display apparatus 100 is reduced.

Figure 4A:
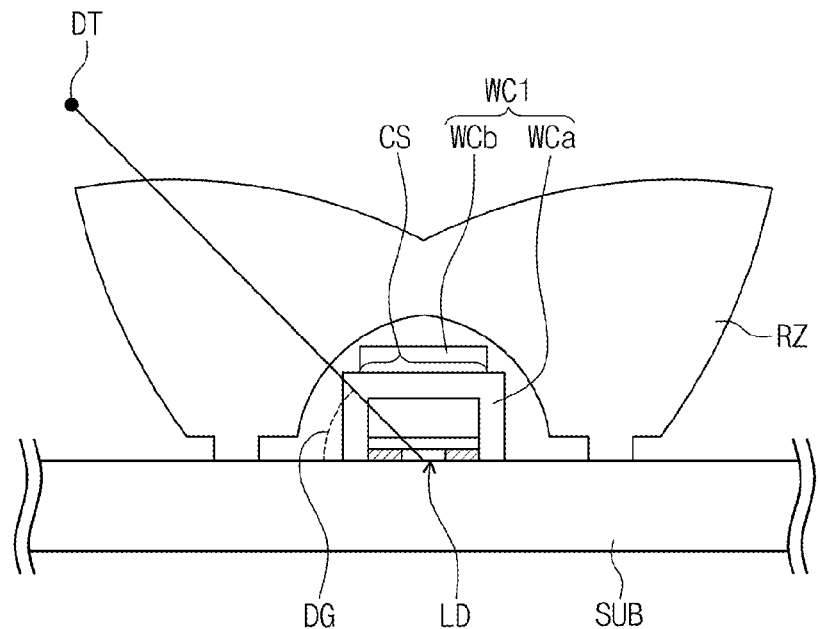
FIG. 4A is an enlarged cross-sectional view showing a portion of a display apparatus according to another exemplary embodiment of the present disclosure.
Figure 4B:
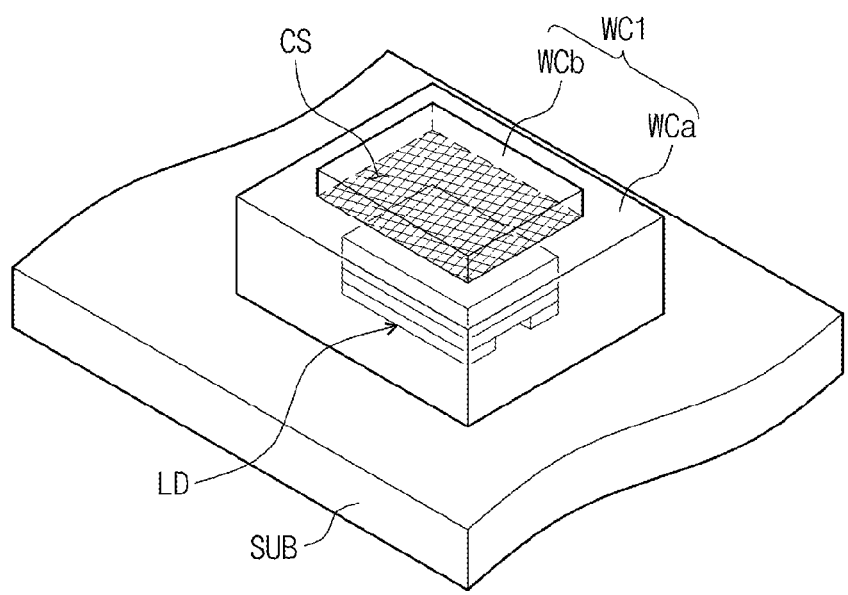
FIG. 4B is a perspective view showing a light source and a wavelength converting member shown in FIG. 4A.

FIG. 4A is an enlarged cross-sectional view showing a portion of a display apparatus according to another exemplary embodiment of the present disclosure and FIG. 4B is a perspective view showing a light source and a wavelength converting member shown in FIG. 4A. In FIGS. 4A and 4B, the same reference numerals denote the same elements in FIGS. 2 and 3, and thus detailed descriptions of the same elements will be omitted.

Referring to FIGS. 4A and 4B, a wavelength converting member WC1 is disposed on a light source LD to cover the light source LD and to convert a wavelength of the light. The wavelength converting member WC1 includes a first auxiliary wavelength converting member WCa and a second auxiliary wavelength converting member WCb.

The first auxiliary wavelength converting member WCa covers the light source LD and the second auxiliary wavelength converting member WCb is disposed above the light source LD such that the first auxiliary wavelength converting member WCa is disposed between the light source LD and the second auxiliary wavelength converting member WCb. The first auxiliary wavelength converting member WCa has a size greater than that of the second auxiliary wavelength converting member WCb when viewed in a plan view.

Hereinafter, a surface at which the first auxiliary wavelength converting member WCa meets with the second auxiliary wavelength converting member WCb is referred to as a contact surface CS. The contact surface CS is surrounded by the first auxiliary wavelength converting member WCa which is shown in FIGS. 4A and 4B as not contacting the second auxiliary wavelength converting member WCb when viewed in a plan view.

Each of the first and second auxiliary wavelength converting members WCa and WCb is formed by dispersing a wavelength converting material, i.e., a fluorescent substance, in a transparent resin, e.g., a silicon resin, an epoxy resin, etc. The fluorescent substance includes at least one of a garnet-based fluorescent substance (YAG, TAG), a silicate-based fluorescent substance, a nitride-based fluorescent substance, and an oxynitride-based fluorescent substance.

According to another embodiment, a quantum dot may be used as the wavelength converting material.

In the present exemplary embodiment, the first auxiliary wavelength converting member WCa may be integrally formed with the second auxiliary wavelength converting member WCb and include the same material as that of the second auxiliary wavelength converting member WCb. According to another embodiment, the first and second auxiliary wavelength converting members WCa and WCb may include different materials from each other. For instance, the first auxiliary wavelength converting member WCa may include the transparent resin and the fluorescent substance dispersed in the transparent resin and the second auxiliary wavelength converting member WCb may include only the transparent resin.

To form the wavelength converting member WC1, the first auxiliary wavelength converting member WCa is formed, and then the second auxiliary wavelength converting member WCb is formed according to a color coordinate of the first auxiliary wavelength converting member WCa.

When the size of the first auxiliary wavelength converting member WCa is greater than the size of the second auxiliary wavelength converting member WCb in a plan view, the color deviation caused by the angle at which the user views the light source LD is reduced. When the color deviation caused by the angle at which the user views the light source LD is reduced, the backlight unit 120 (refer to FIG. 1) provides the display panel 110 (refer to FIG. 1) with the uniform white light. As a result, the display quality of the display apparatus 100 (refer to FIG. 1) is improved.

Figure 5:
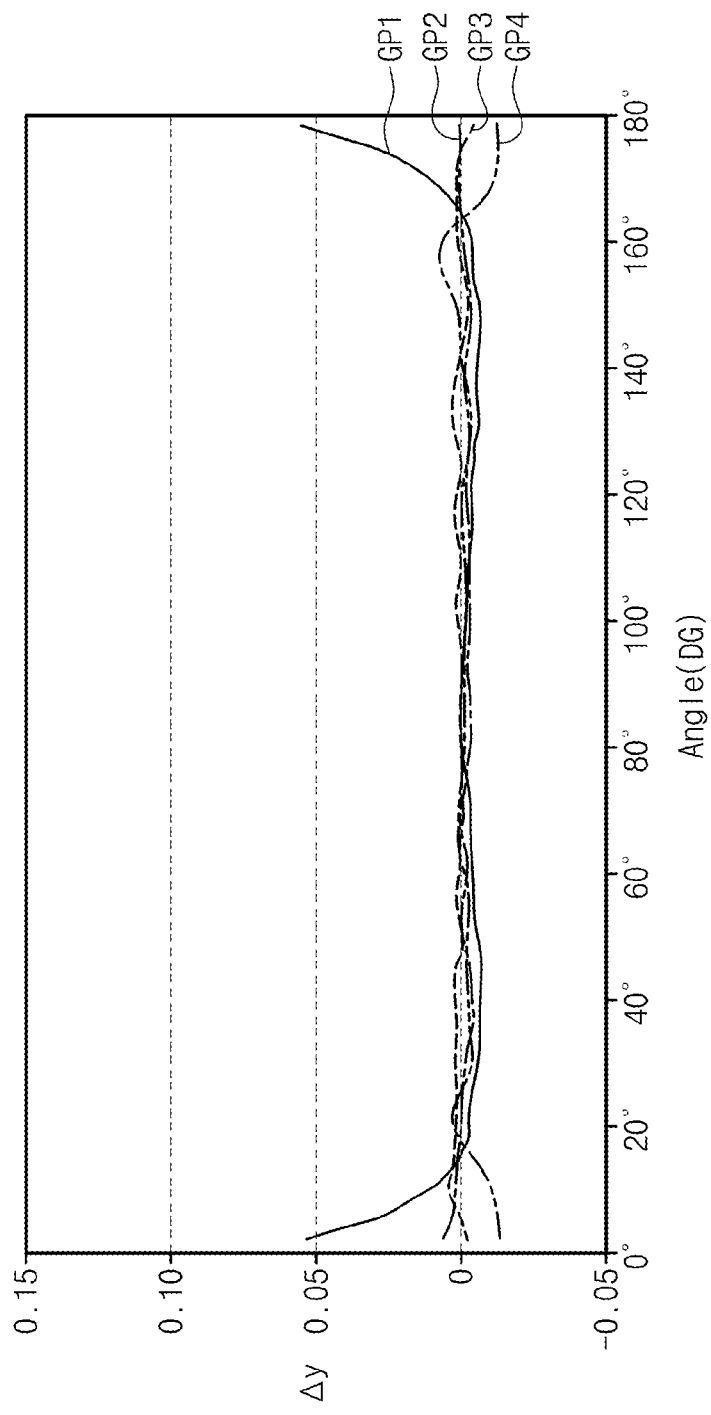
FIG. 5 is a graph showing a color deviation as a function of an angle.

FIG. 5 is a graph showing the color deviation as a function of the angle.

Referring to FIG. 5, an x-axis of each of first, second, third, and fourth graphs GP1, GP2, GP3, and GP4 represents an angle DG (refer to FIG. 4A) between the surface of the substrate SUB (refer to FIG. 4A) and a position DT (refer to FIG. 4A) at which the color coordinate is measured, and a y-axis of each of the first, second, third, and fourth graphs GP1, GP2, GP3, and GP4 represents the deviation in color between a y-coordinate value of a reference white light on color coordinates determined by CIE (Commission International de l'Eclarage) and a y-coordinate value of a measured color coordinate.

The blue light emitted from the light source LD (refer to FIG. 4A) is partially converted to the yellow light while passing through the wavelength converting member WC1 (refer to FIG. 4A), and then the blue light is mixed with the yellow light to form the white light. The deviation of the y coordinate value is 'the y-coordinate value of the measured color coordinate' minus 'the y-coordinate value of the reference white light on color coordinate'. When the deviation of the y coordinate value is a positive deviation, the light is yellowish, and when the deviation of the y coordinate value is a negative deviation, the light is bluish.

The first graph GP1 represents the color deviation when the wavelength converting member has the rectangular shape, the second graph GP2 represents the color deviation when the wavelength converting member WC (refer to FIG. 2) has the trapezoid shape, the third graph GP3 represents the color deviation when the lens RZ (refer to FIG. 2) is disposed on the wavelength converting member WC (refer to FIG. 2), and the fourth graph GP4 represents the color deviation when the lens RZ (refer to FIG. 4A) is disposed on the wavelength converting member WC1 (refer to FIG. 4A).

Referring to the first graph GP1, the color deviation between about 0 degrees and about 20 degrees and between about 160 degrees and about 180 degrees is about +0.04.

Accordingly, when the angle DG is in a range from about 0 degrees to about 20 degrees and from about 160 degrees to about 180 degrees, the white light is yellowish white light.

Referring to the second, third, and fourth graphs GP2, GP3, and GP4, the color deviation between about 0 degrees and about 20 degrees and between about 160 degrees and about 180 degrees is about +0.01. The color deviation represented by the second, third, and fourth graphs GP2, GP3, and GP4 is reduced to one fourth compared with that represented by the first graph GP1. Therefore, the backlight unit 120 (refer to FIG. 1) may generate the light having reduced color deviation by controlling the shape of the wavelength converting member, and thus the display quality of the display apparatus 100 (refer to FIG. 1) may be improved.

Figure 6:
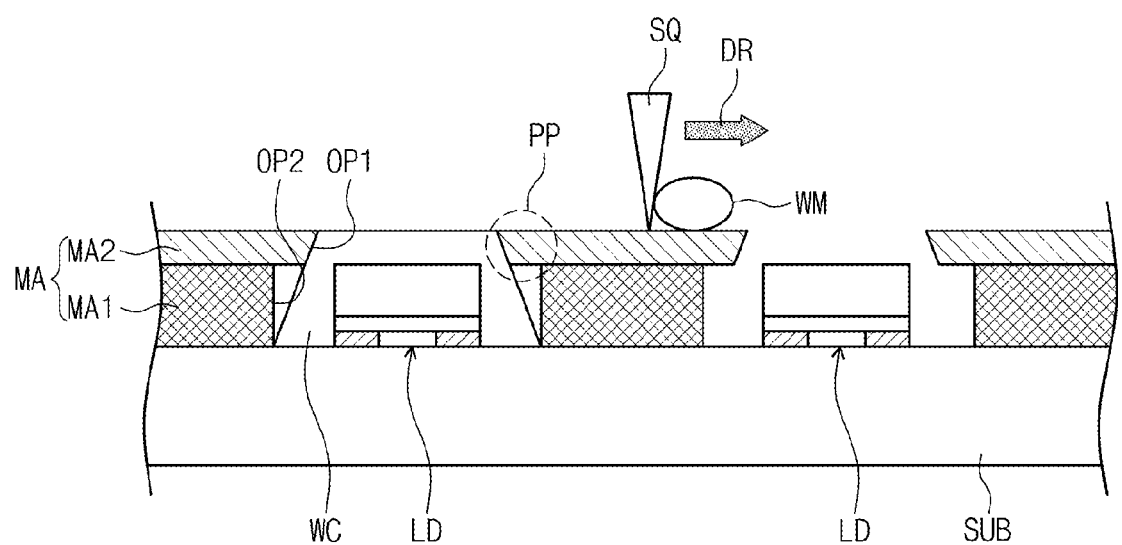
FIG. 6 is a cross-sectional view showing a portion of a manufacturing method of the display apparatus shown in FIG. 1.

FIG. 6 is a cross-sectional view showing a portion of a manufacturing method of the display apparatus 100 shown in FIG. 1.

Referring to FIG. 6, the wavelength converting member WC is formed by a squeeze manner using a mask MA after the mask MA is disposed on the substrate SUB on which the light source LD is mounted.

The mask MA includes a first auxiliary mask MA1 and a second auxiliary mask MA2. The first auxiliary mask MA1 is provided with a second opening OP2 formed therethrough and the second auxiliary mask MA2 is provided with a first opening OP1 formed therethrough. The second opening OP2 is defined under the first opening OP1 and has a size greater than that of the first opening OP1. In the present exemplary embodiment, the first auxiliary mask MA1 may be integrally formed with the second auxiliary mask MA2.

A squeezer SQ moves in one direction DR along an upper surface of the mask MA to push the transparent resin WM including the wavelength converting material. The transparent resin WM including the wavelength converting material is a liquefied material and coated on the light source LD through the first opening OP1. The transparent resin WM including the wavelength converting material is coated on the light source LD through the mask MA in which the second opening OP2 greater than the first opening OP1 is disposed under the first opening OP1. Accordingly, the transparent resin WM including the wavelength converting material smoothly flows down through the first and second openings OP1 and OP2 to form the wavelength converting member WC having the trapezoid shape in the cross-sectional view.

In the present exemplary embodiment, a protruded portion PP disposed adjacent to the first opening OP1 has the rectangular shape in a cross-sectional view, but it should not be limited thereto or thereby. That is, the protruded portion PP may have a right-angled rectangular shape or a right-angled triangular shape. When the protruded portion PP has the right-angled triangular shape, a hypotenuse of the right-angled triangular shape is disposed to face the substrate SUB.

Figure 7A:
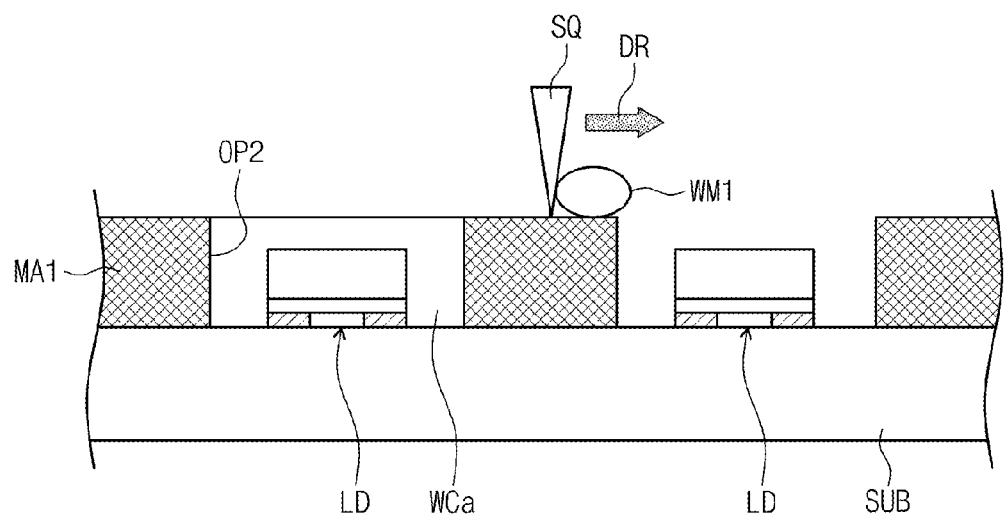
FIGS. 7A and 7B are cross-sectional views showing portions of a manufacturing method of the display apparatus shown in FIG. 4A.
Figure 7B:
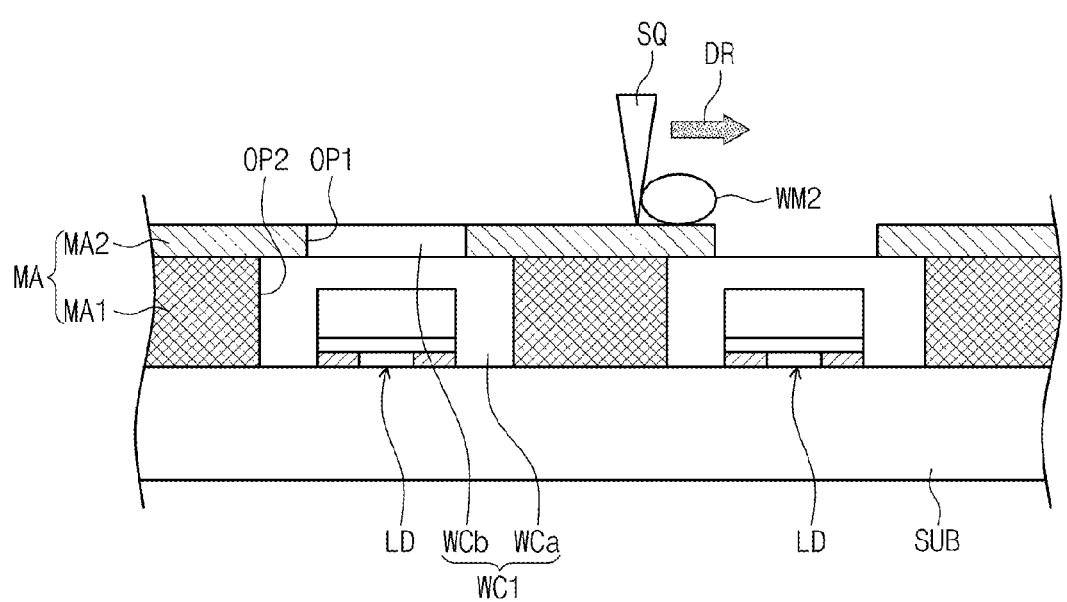

FIGS. 7A and 7B are cross-sectional views showing portions of a manufacturing method of the display apparatus shown in FIG. 4A.

Referring to FIGS. 7A and 7B, a mask MA includes a first auxiliary mask MA1 and a second auxiliary mask MA2. The first auxiliary mask MA1 is provided with a second opening OP2 formed therethrough and the second auxiliary mask MA2 is provided with a first opening OP1 formed therethrough.

Referring to FIG. 7A, the first auxiliary mask MA1 is disposed above the substrate SUB on which the light source LD is mounted. A squeezer SQ moves in one direction along an upper surface of the first auxiliary mask MA1 and pushes in a first material WM1 through the second opening OP2. The first material WM1 is a liquefied material and is coated on the light source LD through the second opening OP2 to form the first auxiliary wavelength converting member WCa.

The first material WM1 is formed by dispersing the wavelength converting material, in the transparent resin, e.g., a silicon resin, an epoxy resin, etc. The wavelength converting material may be the fluorescent substance. The fluorescent substance includes at least one of a garnet-based fluorescent substance (YAG, TAG), a silicate-based fluorescent substance, a nitride-based fluorescent substance, and an oxynitride-based fluorescent substance. According to another embodiment, a quantum dot may be used as the wavelength converting material.

Referring to FIG. 7B, the second auxiliary mask MA2 is disposed on the first auxiliary mask MA1 after the first auxiliary wavelength converting member WCa. The squeezer SQ moves in one direction along an upper surface of the second auxiliary mask MA2 and pushes in a second material WM2 through the first opening OP1. The second material WM2 is a liquefied material and is coated on the first auxiliary wavelength converting member WCa through the first opening OP1 to form the second auxiliary wavelength converting member WCb. Since the first opening OP1 has a size smaller than that of the second opening OP2, the second auxiliary wavelength converting member WCb has a size smaller than that of the first auxiliary wavelength converting member WCa.

The second material WM2 includes the same material as the first material WM1. For instance, the second material WM2 includes the transparent resin, such as a silicon or epoxy resin, and the fluorescent substance dispersed in the transparent resin. According to another embodiment, the second material WM2 may include only the transparent resin, e.g., a silicon resin, an epoxy resin, etc.

The second material WM2 is selected in accordance with the color coordinate of the first auxiliary wavelength converting member WCa. To this end, a concentration of the fluorescent substance included in the transparent resin may be controlled in accordance with the color coordinate. That is, since the second material WM2 is selected in accordance with the color coordinate of the first auxiliary wavelength converting member WCa after the first auxiliary wavelength converting member WCa is formed, the color coordinate may be easily controlled. As a result, a manufacturing yield may be prevented from being degraded due to defects in the color coordinate.

Figure 8:
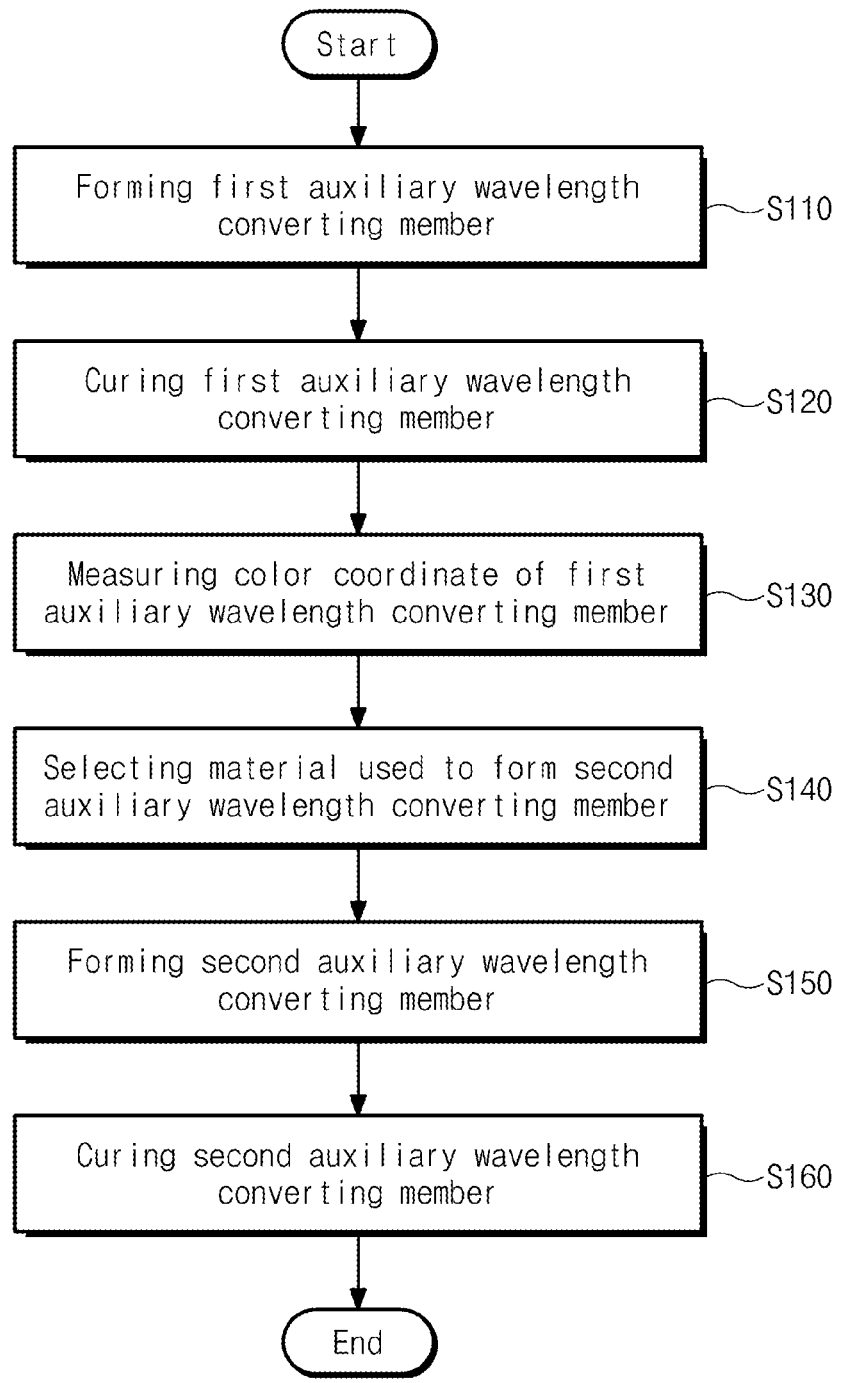
FIG. 8 is a flowchart showing a method of forming a wavelength converting member according to an exemplary embodiment of the present disclosure.

FIG. 8 is a flowchart showing a method of forming a wavelength converting member according to an exemplary embodiment of the present disclosure. Hereinafter, for the convenience of explanation, the reference numerals shown in FIGS. 7A and 7B will be used in the following descriptions.

Referring to FIGS. 7A, 7B, and 8, the first auxiliary wavelength converting member WCa is formed on the substrate SUB on which the light source LD is mounted (S110). Then, the first auxiliary wavelength converting member WCa is primary cured (S120).

After the first auxiliary wavelength converting member WCa is primary cured, the color coordinate of the first auxiliary wavelength converting member WCa is measured (S130). The material used to form the second auxiliary wavelength converting member WCb is selected in accordance with the color coordinate of the first auxiliary wavelength converting member WCa (S140). The second material WM2 used to form the second auxiliary wavelength converting member WCb may be selected by controlling the concentration of the fluorescent substance included in the transparent resin in accordance with the color coordinate of the first auxiliary wavelength converting member WCa.

The color coordinate of the first auxiliary wavelength converting member WCa is changed while the first auxiliary wavelength converting member WCa is cured. According to the present exemplary embodiment, since the second material WM2 used to form the second auxiliary wavelength converting member WCb is selected by measuring the changed color coordinate of the first auxiliary wavelength converting member WCa during the first curing process, the color coordinate may be more finely controlled.

The second auxiliary wavelength converting member WCb is formed on the first auxiliary wavelength converting member WCa using the selected second material WM2 (S150). The second auxiliary wavelength converting member WCb is secondary cured to form the wavelength converting member WC1 (S160).

According to the present exemplary embodiment, after the first auxiliary wavelength converting member WCa is formed, the second auxiliary wavelength converting member WCb is formed in accordance with the color coordinate of the first auxiliary wavelength converting member WCa. Accordingly, the color coordinate may be easily controlled and defects of the color coordinate may be reduced.

FIG. 9 is a flowchart showing a method of forming a wavelength converting member according to another exemplary embodiment of the present disclosure. Hereinafter, for the convenience of explanation, the reference numerals shown in FIGS. 7A and 7B will be used in the following descriptions.

Referring to FIGS. 7A, 7B, and 9, the first auxiliary wavelength converting member WCa is formed on the substrate SUB on which the light source LD is mounted (S210). The color coordinate of the first auxiliary wavelength converting member WCa is measured (S220). The material used to form the second auxiliary wavelength converting member WCb is selected in accordance with the color coordinate of the first auxiliary wavelength converting member WCa (S230). The second auxiliary wavelength converting member WCb is formed on the first auxiliary wavelength converting member WCa (S240). The first and second auxiliary wavelength converting members WCa and WCb are cured to form the wavelength converting member WC1 (S250).

According to the present exemplary embodiment, since the second auxiliary wavelength converting member WCb is formed before the first auxiliary wavelength converting member WCa is cured, a range of selection of the second material WM2 used to form the second auxiliary wavelength converting member WCb is quite broad.

In more detail, a case that a density of the fluorescent substance included in the first auxiliary wavelength converting member WCa is required to be lowered due to the high density of the converted light when the color coordinate of the first auxiliary wavelength converting member WCa is measured will be described. In this case, the material including only the transparent resin without the fluorescent substance may be selected as the second material. When the second material WM2 is coated on the first auxiliary wavelength converting member WCa that is not cured, the second material WM2 may be mixed with the first auxiliary wavelength converting member WCa that is not cured. As a result, the fluorescent substance included in the first auxiliary wavelength converting member WCa partially moves to the second auxiliary wavelength converting member WCb, and thus the density of the wavelength converting member WC1 is lowered.

According to the present exemplary embodiment, after the first auxiliary wavelength converting member WCa is formed, the second auxiliary wavelength converting member WCb is formed in accordance with the first auxiliary wavelength converting member WCa. Therefore, the color coordinate is easily controlled and defects in the color coordinate are reduced.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A method of manufacturing a display apparatus comprising:
    providing a backlight unit under a display panel to provide a light to the display panel, this provision of the backlight unit comprising:
    disposing a light source on a substrate to emit the light;
    disposing a mask above the light source, the mask comprising a first opening formed through the mask and a second opening greater than the first opening, disposed under the first opening, and formed through the mask; and
    providing a transparent resin comprising a wavelength converting material on the light source through the first and second openings of the mask to form a wavelength converting member covering the light source, wherein a width in a cross section of the wavelength converting member along a direction substantially vertical to the substrate becomes smaller as a distance from the substrate becomes greater.

2. The method of claim 1, wherein formation of the wavelength converting member comprises:
    forming a first auxiliary wavelength converting member using the second opening; and
    forming a second auxiliary wavelength converting member on the first auxiliary wavelength converting member using the first opening.

3. The method of claim 2, wherein formation of the wavelength converting member further comprises curing the first and second auxiliary wavelength converting members after the first and second auxiliary wavelength converting members are formed.

4. The method of claim 2, wherein formation of the wavelength converting member comprises:
    primary curing the first auxiliary wavelength converting member;
    forming the second auxiliary wavelength converting member after the first auxiliary wavelength converting member is primary cured; and
    secondary curing the second auxiliary wavelength converting member.

5. The method of claim 4, wherein formation of the wavelength converting member further comprises measuring a color coordinate of the first auxiliary wavelength converting member before the second auxiliary wavelength converting member is formed and after the first auxiliary wavelength converting member is primary cured.

6. The method of claim 5, wherein the first and second auxiliary wavelength converting members comprise the transparent resin and the wavelength converting material.

7. The method of claim 6, wherein formation of the wavelength converting member further comprises controlling an amount of the wavelength converting material of the second auxiliary wavelength converting member in accordance with the color coordinate of the first auxiliary wavelength converting member.

8. The method of claim 2, wherein the first and second auxiliary wavelength converting members comprise a wavelength converting material.

9. The method of claim 1, wherein formation of the wavelength converting member further comprises measuring a color coordinate of the first auxiliary wavelength converting member before the second auxiliary wavelength converting member is formed.

10. The method of claim 1, wherein formation of the wavelength converting member further comprises selecting a material used to form the second auxiliary wavelength converting member in accordance with the color coordinate of the first auxiliary wavelength converting member.

11. The method of claim 10, wherein the first auxiliary wavelength converting member comprises the transparent resin and the wavelength converting material and the second auxiliary wavelength converting member comprises the transparent resin.

12. The method of claim 11, wherein the second auxiliary wavelength converting member further comprises the wavelength converting material.

13. The method of claim 12, wherein the wavelength converting material included in the first auxiliary wavelength converting member partially moves to the second auxiliary wavelength converting material by mixing the first auxiliary wavelength converting member with the second auxiliary wavelength converting member.

14. The method of claim 1, wherein formation of the wavelength converting member further comprises controlling an amount of the wavelength converting material included in the second auxiliary wavelength converting member in accordance with the color coordinate of the first auxiliary wavelength converting member.

15. The method of claim 1, further comprising disposing a lens part on the wavelength converting member.

16. The method of claim 1, wherein disposition of the mask comprises:
    disposing a first auxiliary mask provided with the second opening formed through the mask on the light source; and
    disposing a second auxiliary mask provided with the first opening formed through the mask on the light source.

17. The method of claim 1, wherein the wavelength converting member is formed by a squeeze manner.

18. The method of claim 1, comprised of:
    formation of the wavelength converting member comprises:
    forming a first auxiliary wavelength converting member covering the light source; and
    forming a second auxiliary wavelength converting member disposed on the light source such that the first auxiliary wavelength converting member is disposed between the second auxiliary wavelength converting member and the light source, wherein the first auxiliary wavelength converting member has a size greater than a size of the second auxiliary wavelength converting member when viewed in a plan view.

19. The method of claim 18, further comprised of disposing a lens part on the wavelength converting member to diffuse the light.

20. The method of claim 1, wherein, when a surface at which the second auxiliary wavelength converting member meets with the first auxiliary wavelength converting member is defined as a contact surface, the contact surface is surrounded by the first auxiliary wavelength converting member when viewed in a plan view.

* * * * *